United States Patent
Kim et al.

(10) Patent No.: US 10,797,119 B2
(45) Date of Patent: Oct. 6, 2020

(54) ELECTROLUMINESCENT DISPLAY DEVICE

(71) Applicant: LG Display Co., Ltd., Seoul (KR)

(72) Inventors: HeeJin Kim, Paju-si (KR); HakMin Lee, Paju-si (KR); SungSoo Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/210,682

(22) Filed: Dec. 5, 2018

(65) Prior Publication Data

US 2019/0181201 A1 Jun. 13, 2019

(30) Foreign Application Priority Data

Dec. 11, 2017 (KR) .................. 10-2017-0169203

(51) Int. Cl.
*H01L 27/32* (2006.01)
*H01L 51/52* (2006.01)
*H01L 51/50* (2006.01)

(52) U.S. Cl.
CPC ...... *H01L 27/3246* (2013.01); *H01L 27/3276* (2013.01); *H01L 51/5036* (2013.01); *H01L 51/5056* (2013.01); *H01L 51/5072* (2013.01); *H01L 51/5092* (2013.01); *H01L 51/5218* (2013.01); *H01L 51/5225* (2013.01); *H01L 51/5234* (2013.01); *H01L 27/3211* (2013.01); *H01L 27/3223* (2013.01); *H01L 2251/5315* (2013.01); *H01L 2251/558* (2013.01)

(58) Field of Classification Search
CPC .................................................. H01L 27/3276
See application file for complete search history.

(56) References Cited

U.S. PATENT DOCUMENTS

| 9,590,203 | B2 | 3/2017 | Yoon et al. | |
|---|---|---|---|---|
| 2003/0146692 | A1* | 8/2003 | Uchida | .................. H05B 33/00 313/504 |
| 2008/0238295 | A1 | 10/2008 | Takei et al. | |
| 2009/0212696 | A1* | 8/2009 | Terao | .................. H01L 51/5265 313/506 |
| 2011/0297943 | A1 | 12/2011 | Kim et al. | |
| 2012/0268000 | A1* | 10/2012 | Choi | .................. H01L 51/5234 313/504 |
| 2014/0291648 | A1 | 10/2014 | Yamazaki et al. | |

(Continued)

FOREIGN PATENT DOCUMENTS

| KR | 10-1067344 B1 | 9/2011 |
|---|---|---|
| KR | 10-2015-0144890 A | 12/2015 |

*Primary Examiner* — Donald L Raleigh
(74) *Attorney, Agent, or Firm* — Fenwick & West LLP

(57) ABSTRACT

Disclosed is an electroluminescent display device comprising a substrate, a first electrode provided on the substrate, a bank configured to cover an end of the first electrode and to define an emission area, an emission layer provided in the emission area defined by the bank, and a second electrode provided on the emission layer, wherein the emission layer includes a hole injecting layer, a hole transporting layer, and an emitting material layer, and the second electrode includes a material having the electron injecting property and electron transporting property, wherein the electroluminescent display device is capable of reducing manufacturing cost and processing time by providing the emission layer and the second electrode formed by a solution process.

29 Claims, 7 Drawing Sheets

(56) References Cited

U.S. PATENT DOCUMENTS

| | | | | |
|---|---|---|---|---|
| 2014/0306260 A1* | 10/2014 | Yamazaki | ........... | H01L 51/5012 |
| | | | | 257/99 |
| 2014/0346449 A1* | 11/2014 | Choi | ................... | H01L 27/3211 |
| | | | | 257/40 |
| 2016/0035811 A1* | 2/2016 | Choi | ................... | H01L 51/5221 |
| | | | | 257/72 |
| 2016/0365531 A1 | 12/2016 | Hu et al. | | |
| 2017/0141345 A1* | 5/2017 | Park | ................... | H01L 51/5221 |
| 2018/0331326 A1* | 11/2018 | Woo | ................... | H01L 51/5275 |

\* cited by examiner

ELECTROLUMINESCENT DISPLAY DEVICE

CROSS-REFERENCE TO RELATED APPLICATIONS

This patent application claims priority to Republic of Korea Patent Application No. 10-2017-0169203, filed on Dec. 11, 2017 in the Korean Intellectual Property Office, which is incorporated herein by reference in its entirety.

BACKGROUND

Technical Field

The present disclosure relates to an electroluminescent display device, and more particularly, to an electroluminescent display device manufactured by a solution process.

Description of the Related Art

An electroluminescent display device is provided in such a way that an emission layer is formed between two electrodes. Accordingly, as the emission layer emits light responsive to an electric field between the two electrodes, an image is displayed on the electroluminescent display device.

The emission layer may be formed of an organic material which emits light when an exciton is produced by a combination of electron and hole, and the exciton falls to a ground state from an excited state. Otherwise the emission layer may be formed of an inorganic material such as quantum dots.

Hereinafter, the electroluminescent display device according to the related art will be described with reference to the accompanying drawings.

FIG. 1 is a cross sectional view illustrating the electroluminescent display device according to the related art.

As shown in FIG. 1, the electroluminescent display device according to the related art may include a substrate 10, a circuit device layer 20, a first electrode 30, a bank 40, an emission layer 50, and a second substrate 60.

The circuit device layer 20 is formed on the first substrate 10. Herein, various signal lines, a thin film transistor, and a capacitor are formed in the circuit device layer 20.

The first electrode 30 is formed on the circuit device layer 20. The first electrode 30 is patterned for each pixel, wherein the first electrode 30 functions as an anode of the electroluminescent display device.

The bank 40 is formed in a matrix configuration, to thereby define a plurality of emission areas.

The emission layer 50 is formed in each of the plurality of emission areas defined by the bank 40. The emission layer 50 is formed in each of the plurality of emission areas by a solution process using an inkjet apparatus.

The second electrode 60 is formed on the emission layer 50, wherein the second electrode 60 functions as a cathode of the electroluminescent display device.

In case of the related art electroluminescent display device, the emission layer 50 is formed by the solution process, and then the second electrode 60 is formed by a deposition process.

Accordingly, in case of the related art, the inkjet apparatus for forming the emission layer 50 and a deposition apparatus for forming the second electrode 60 are inevitably required, respectively so that a manufacturing cost is increased. In addition, the substrate 10 has to be moved to the different apparatuses so as to form the emission layer 50 and the second electrode 60, thereby causing an increase of process time.

SUMMARY

The present disclosure has been made in view of the above problems, and it is an object of the present disclosure to provide an electroluminescent display device capable of reducing manufacturing cost and processing time by providing an emission layer and a second electrode formed by a solution process.

In accordance with an aspect of the present disclosure, the above and other objects can be accomplished by an electroluminescent display device comprising a substrate, a first electrode provided on the substrate, a bank configured to cover an end of the first electrode and to define an emission area, an emission layer provided in the emission area defined by the bank, and a second electrode provided on the emission layer, wherein the emission layer includes a hole injecting layer, a hole transporting layer, and an emitting material layer, and the second electrode includes a material having the electron injecting property and electron transporting property.

In accordance with another aspect of the present disclosure, there is provided an electroluminescent display device comprising a substrate, a first electrode provided on the substrate, a bank configured to cover an end of the first electrode and to define a first emission area, a second emission area, and a third emission area, a first emission layer provided in the first emission area, a second emission layer provided in the second emission area, a third emission layer provided in the third emission area, a second electrode provided on the first emission layer, a second electrode provided on the second emission layer, and a second electrode provided on the third emission layer, and a connection layer for connecting the second electrode provided on the first emission layer, the second electrode provided on the second emission layer, and the second electrode provided on the third emission layer with each other.

In accordance with a further aspect of the present disclosure, there is provided an electroluminescent display device comprising a substrate including an active area for displaying an image, a dummy area provided in the periphery of the active area, a bank configured to define an emission area on the active area of the substrate, a dummy emission area on the dummy area of the substrate, a plurality of emission layers provided in the emission area defined by the bank, a plurality of electrodes respectively provided on the plurality of emission layers, a plurality of dummy emission layers provided in the dummy emission area defined by the bank, a plurality of dummy electrodes respectively provided on the plurality of dummy emission layers, and a connection layer for connecting the plurality of electrodes with each other.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings.

DETAILED DESCRIPTION

Figure 1:
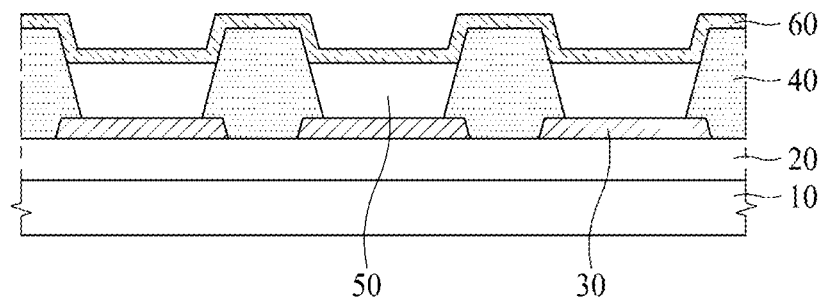
FIG. 1 is a cross sectional view illustrating the electroluminescent display device according to the related art.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other or may be carried out together in a co-dependent relationship.

Hereinafter, an electroluminescent display device according to the embodiment of the present disclosure will be described in detail with reference to the accompanying drawings.

Figure 2:
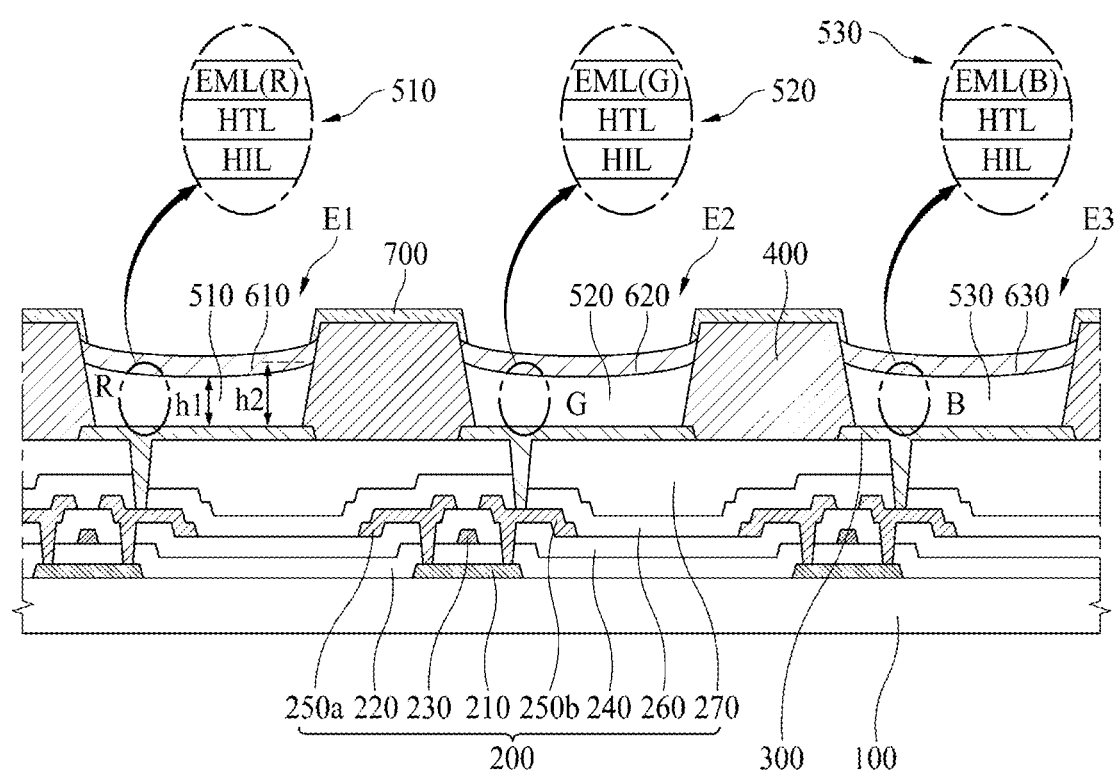
FIG. 2 is a cross sectional view illustrating an electroluminescent display device according to one embodiment of the present disclosure.

FIG. 2 is a cross sectional view illustrating an electroluminescent display device according to one embodiment of the present disclosure.

As shown in FIG. 2, the electroluminescent display device according to one embodiment of the present disclosure may include a substrate 100, a circuit device layer 200, a first electrode 300, a bank 400, an emission layer 510, 520 and 530, a second electrode 610, 620 and 630, and a connection layer 700.

The first substrate 100 may be formed of a glass or plastic material, but not limited to this material. The first substrate 100 may be formed of a transparent material or an opaque material.

When the electroluminescent display device according to one embodiment of the present disclosure is formed in a top emission type in which the emitted light advances toward an upper side, the first substrate 100 may be formed of the opaque material as well as the transparent material. Meanwhile, when the electroluminescent display device according to one embodiment of the present disclosure is formed in a bottom emission type in which the emitted light advances toward a lower side, the first substrate 100 may be formed of the transparent material.

The circuit device layer 200 is formed on the substrate 100.

The circuit device layer 200 includes an active layer 210, a gate insulating film 220, a gate electrode 230, an insulating interlayer 240, a source electrode 250a, a drain electrode 250b, a passivation layer 260, and a planarization layer 270.

The active layer 210 is formed on the substrate 100. The active layer 210 may be formed of a silicon-based semiconductor material or oxide-based semiconductor material, but not limited to these materials. Meanwhile, although not shown, a light-shielding layer may be additionally provided between the substrate 100 and the active layer 210 so that it is possible to prevent light from being advanced to the active layer 210, to thereby prevent a deterioration of the active layer 210.

The gate insulating film 220 is formed on the active layer 210, to thereby insulate the active layer 210 and the gate electrode 230 from each other.

The gate electrode 230 is formed on the gate insulating film 220.

The insulating interlayer 240 is formed on the gate electrode 230, wherein the insulating interlayer 240 insulates the gate electrodes 230 from the source/drain electrodes 250a/250b.

The source electrode 250a is provided at a predetermined interval from the drain electrode 250b, wherein the source electrode 250a and the drain electrode 250b facing each other are provided on the insulating interlayer 240. The source electrode 250a and the drain electrode 250b are respectively connected with one end and another end of the active layer 210 via contact holes provided in the insulating interlayer 240 and the gate insulating film 220.

The passivation layer 260 is provided on the source electrode 250a and the drain electrode 250b, to thereby protect a thin film transistor.

The planarization layer 270 is formed on the passivation layer 260, to thereby planarize a surface of the substrate 100.

Accordingly, the circuit device layer 200 includes the thin film transistor having the gate electrode 230, the active layer 210, the source electrode 250a, and the drain electrode 250b. FIG. 2 shows the thin film transistor having a top gate structure where the gate electrode 230 is provided above the active layer 210, but embodiments of the present disclosure are not limited to this type. For example, the thin film transistor having a bottom gate structure where the gate electrode 230 is provided below the active layer 210 may be provided in the circuit device layer 200.

In the circuit device layer 200, a circuit device including various signal lines, a thin film transistor, and a capacitor is provided by each pixel. The signal lines (not shown) may include a gate line, a data line, a power line, and a reference line, and the thin film transistor may include a switching thin film transistor, a driving thin film transistor, and a sensing thin film transistor.

Accordingly, as the switching thin film transistor is switched in accordance with a gate signal supplied to the gate line, a data voltage provided from the data line is supplied to the driving thin film transistor by the switching thin film transistor.

Accordingly, as the driving thin film transistor is switched on in accordance with the data voltage supplied from the switching thin film transistor, a data current is generated by power supplied from the power line, and the generated data current is supplied to the first electrode 300.

The sensing thin film transistor senses a threshold voltage deviation of the driving thin film transistor, which causes a deterioration of picture quality. The sensing thin film transistor supplies a current of the driving thin film transistor to the reference line in response to a sensing control signal supplied from the gate line or an additional sensing line.

The capacitor maintains the data voltage supplied to the driving thin film transistor for one frame period. The capacitor is connected with each of gate and source terminals of the driving thin film transistor.

The first electrode 300 is formed on the circuit device layer 200. The first electrode 300 is patterned per each pixel. The first electrode 300 functions as an anode of the electroluminescent display device.

When the electroluminescent display device according to one embodiment of the present disclosure is formed in a top emission type, the first electrode 300 may include a reflective material for upwardly reflecting the light emitted from the emission layer 500. In this case, the first electrode 300 may be formed with a deposition structure including the reflective material and transparent conductive material. When the electroluminescent display device according to one embodiment of the present disclosure is formed in a bottom emission type, the first electrode 300 may be formed of the transparent conductive material.

The first electrode 300 is connected with the drain electrode 250b of the thin film transistor via a contact hole provided in the planarization layer 270 and the passivation layer 260. In some cases, the first electrode 300 may be connected with the source electrode 250a of the thin film transistor via a contact hole provided in the planarization layer 270 and the passivation layer 260.

The bank 400 is formed in a matrix configuration as defining the boundary line between each of the plurality of pixels, to thereby define an emission area E1, E2 or E3 in each of the plurality of pixels. That is, an opening portion that the bank 400 is not formed in each pixel becomes the emission areas E1, E2 and E3.

The bank 400 covers both ends of the first electrode 300, and the bank 400 is formed on the circuit device layer 200. Thus, the plurality of first electrodes 300 patterned for the plurality of pixels may be insulated from each other by the bank 400.

The bank 400 may be formed of an organic insulating material having a hydrophilic property. In this case, the emission layer 510, 520 and 530 smoothly spreads to a lateral surface of the bank 400 so that it is possible to realize uniformity of the emission areas E1, E2 and E3.

Meanwhile, if the entire area of the bank 400 has the hydrophilic property, the emission layer 510, 520 and 530 formed in any one emission area E1, E2 or E3 overflows into the neighboring emission area E1, E2 or E3 over an upper surface of the bank 400, whereby the emission layer 510, 520 and 530 formed in any one emission area E1, E2 or E3 may be mixed together with the emission layer 510, 520 and 530 formed in the neighboring emission area E1, E2 or E3. Thus, the upper surface of the bank 400 has a hydrophobic property so as to prevent the mixture of the neighboring emission layers 510, 520 and 530, preferably.

To this end, the bank 400 may be obtained by coating a mixture solution of an organic insulating material having the hydrophilic property and a hydrophobic material such as fluorine, and patterning the coated mixture solution by use of a photolithography process. By the light irradiated during the photolithography process, the hydrophobic material such as fluorine may move to an upper portion of the bank 400, whereby the upper portion of the bank 400 may have the hydrophobic property, and the remaining portions of the bank 400 may have the hydrophilic property. In this case, the upper surface of the bank 400 has the hydrophobic property so that it is possible to decrease the spread of the neighboring emission layers 510, 520 and 530 into the upper surface of the bank 400 to some degree, thereby reducing a problem related with the mixture of the neighboring emission layers 510, 520 and 530.

The emission layer 510, 520 and 530 is formed on the first electrode 300. In detail, the emission layer 510, 520 and 530 is formed in the emission area E1, E2 and E3 defined by the bank 400.

The emission layer 510, 520 and 530 is patterned in each of the emission areas E1, E2 and E3, respectively by a solution process without using a mask. In this case, a height h1 of an upper end of the emission layer 510, 520 and 530 in the center of the emission area E1, E2 and E3 after a drying process the solution for forming the emission layer 510, 520 and 530 is lower than a height h2 of an upper end of the emission layer 510, 520 and 530 in the end of the emission area E1, E2 and E3, and more particularly, in the end of the emission area E1, E2 and E3 being in contact with the bank 400. Especially, as shown in the drawings, accordingly as the height of the emission layer 510, 520 and 530 is gradually lowered from the end of the emission area E1, E2 and E3 being in contact with the bank 400 to the center of the emission area E1, E2 and E3, it is possible to realize a gradually-lowered profile shape.

The emission layers 510, 520 and 530 may include the first emission layer 510 provided in the first emission area E1 of the first pixel, the second emission layer 520 provided in the second emission area E2 of the second pixel, and the third emission layer 530 provided in the third emission area E3 of the third pixel.

The first emission layer 510 may include a hole injecting layer HIL, a hole transporting layer HTL, and a red emitting material layer EML(R). The second emission layer 520 may include a hole injecting layer HIL, a hole transporting layer HTL, and a green emitting material layer EML(G). The third emission layer 530 may include a hole injecting layer HIL, a hole transporting layer HTL, and a blue emitting material layer EML(B).

The hole injecting layer HIL is formed in each of the first to third emission areas E1, E2 and E3 by the solution process, whereby the hole injecting layer HIL is included in each of the first emission layer 510, the second emission layer 520, and the third emission layer 530. The hole transporting layer HTL is formed in each of the first to third emission areas E1, E2 and E3 by the solution process, whereby the hole transporting layer HTL is included in each of the first emission layer 510, the second emission layer 520, and the third emission layer 530. The red emitting material layer EML(R), the green emitting material layer EML(G), and the blue emitting material layer EML(B) are respectively formed in the first to third emission areas E1, E2 and E3 by the solution process, whereby the red emitting material layer EML(R), the green emitting material layer EML(G), and the blue emitting material layer EML(B) are respectively included in the first emission layer 510, the second emission layer 520, and the third emission layer 530.

Each of the emission layers 510, 520 and 530 includes the hole injecting layer HIL and the hole transporting layer HTL so as to transmit holes, which are generated in the first electrode 300, to each of the red emitting material layer EML(R), the green emitting material layer EML(G), and the blue emitting material layer EML(B).

Each of the emission layers 510, 520 and 530 does not include an electron injecting layer EIL and an electron transporting layer ETL so as to transmit electrons, which are generated in the second electrode 610, 620 and 630, to each of the red emitting material layer EML(R), the green emitting material layer EML(G), and the blue emitting material layer EML(B). In some embodiments, at least one of the electron injecting layer EIL and the electron transporting layer ETL may be included in each of the emission layers 510, 520 and 530.

The second electrode 610, 620 and 630 is formed on the emission layer 510, 520 and 530. The second electrode 610, 620 and 630 may serve as a cathode of the electroluminescent display device.

In the same manner as the emission layer 510, 520 and 530, the second electrode 610, 620 and 630 may be patterned in each emission area E1, E2 and E3 by a solution process without using a mask. Thus, the second electrode 610 is formed on the first emission layer 510 of the first emission area E1, the second electrode 620 is formed on the second emission layer 520 of the second emission area E2, and the second electrode 630 is formed on the third emission layer 530 of the third emission area E3.

As described above, if the electron injecting layer EIL and the electron transporting layer ETL are not included in the emission layer 510, 520 and 530, the second electrode 610, 620 and 630 may include a material having the electron injecting property and the electron transporting property. In detail, the second electrode 610, 620 and 630 may include a conductive material such as silver (Ag) so that the second electrode 610, 620 and 630 may serve as the cathode of the electroluminescent display device. For realizing the electron injecting property and the electron transporting property, the second electrode 610, 620 and 630 may include at least one among an alkali material, metal oxide, and metal carbonate. The second electrode 610, 620 and 630 may be obtained by mixing at least one among the alkali material, metal oxide, and metal carbonate with ink including silver (Ag), and carrying out the solution process with the above mixing material by the use of inkjet apparatus.

According to one embodiment of the present disclosure, the emission layer 510, 520 and 530 and the second electrode 610, 620 and 630 may be formed by the solution process so that it is possible to reduce the manufacturing cost and process time. Especially, the second electrode 610, 620 and 630 includes the material having the electron injecting property and the electron transporting property so that it is possible to remove the electron injecting layer and the electron transporting layer from the emission layer 510, 520 and 530, thereby considerably shortening a process time for forming the emission layer 510, 520 and 530.

When the electroluminescent display device according to one embodiment of the present disclosure is formed in a top emission type, the second electrode 610, 620 and 630 may be formed of a transparent conductive material for upwardly advancing light emitted from the emission layer 510, 520 and 530 or may be formed at a very thin thickness so as to improve transmittance. When the electroluminescent display device according to one embodiment of the present disclosure is formed in a bottom emission type, the second electrode 610, 620 and 630 may include a reflective material for downwardly reflecting light emitted from the emission layer 510, 520 and 530.

Accordingly, as the second electrode 610, 620 and 630 is formed by the solution process, the second electrode 610, 620 and 630 has a profile corresponding to the profile of the emission layer 510, 520 and 530.

Also, according as each second electrode 610, 620 and 630 is formed in each emission area E1, E2 and E3, the second electrode 610 formed on the first emission layer 510, the second electrode 620 formed on the second emission layer 520, and the second electrode 630 formed on the third emission layer 530 are separated from each other without being connected to each other.

As the second electrode 610 formed on the first emission layer 510, the second electrode 620 formed on the second emission layer 520, and the second electrode 630 formed on the third emission layer 530 are connected to each other by the connection layer 700, a common voltage may be applied to each of the second electrodes 610, 620 and 630. Thus, the connection layer 700 is formed of a conductive material.

The connection layer 700 is distinct from the second electrodes, is provided on the upper surface of the bank 400, and extends to the second electrode 610, 620 and 630, whereby the second electrodes 610, 620 and 630 may be electrically connected with each other. The connection layer 700 extends to an upper surface of the second electrode 610, 620 and 630. If the electroluminescent display device according to the present disclosure is formed in the top emission type, the connection layer 700 may be formed of a transparent conductive material so as to prevent lowering of light transmittance. Meanwhile, when the electroluminescent display device according to the present disclosure is formed in the bottom emission type, the connection layer 700 may be formed of an opaque conductive material. The structure of the connection layer 700 will be readily understood with reference to FIG. 3.

Although not shown in figures, an encapsulation layer may be additionally formed on the second electrode 610, 620 and 630. The encapsulation layer prevents external moisture from being permeated into the emission layer 510, 520 and 530. The encapsulation layer may be formed of an inorganic insulating material, or may be formed in a deposition structure obtained by alternately depositing an organic insulating material and an organic insulating material, but not limited to these structures.

Figure 3:
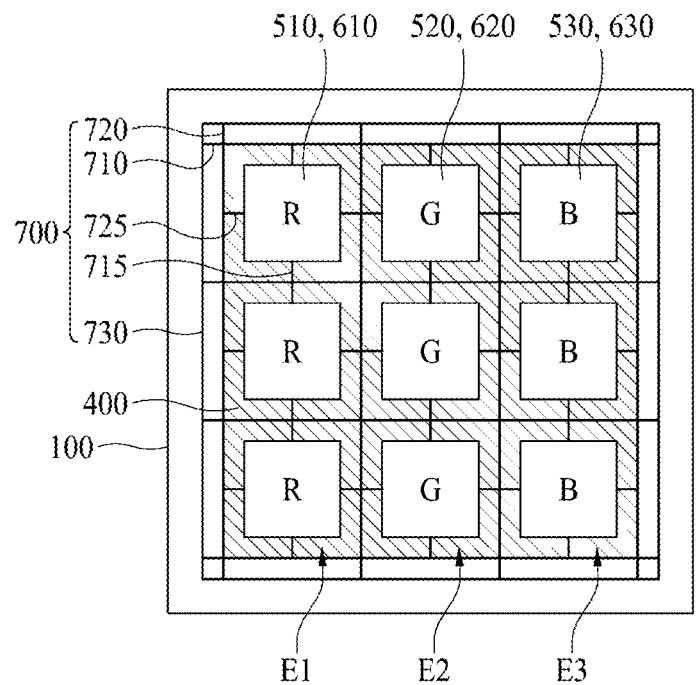
FIG. 3 is a plan view illustrating the electroluminescent display device according to one embodiment of the present disclosure.

FIG. 3 is a plan view illustrating the electroluminescent display device according to one embodiment of the present disclosure.

As shown in FIG. 3, the bank 400 is formed in the matrix configuration on the substrate 100, to thereby define the first emission area E1, the second emission area E2, and the third emission area E3. For reference, the bank 400 is shaded in FIG. 3.

The first emission layer 510 and the second electrode 610 are formed in the first emission area E1, the second emission layer 520 and the second electrode 620 are formed in the second emission area E2, and the third emission layer 530 and the third electrode 630 are formed in the third emission area E3.

The connection layer 700 is formed on the upper surface of the bank 400 while overlapping with the bank 400. The connection layer 700 may include a plurality of first connection lines 710, a plurality of second connection lines 720, a plurality of first connection electrodes 715, a plurality of second connection electrodes 725, and a third connection line 730. The thickness of the connection layer may vary due to a varying profile of a structure on which it is formed. The thickness of the connection layer 700 when it is formed on a surface parallel to the upper surface of the substrate 100 is typically smaller than the second electrode 600.

The plurality of first connection lines 710 extend in a first direction on the upper surface of the bank 400, for example, a horizontal direction. The plurality of second connection lines 720 extend in a second direction on the upper surface of the bank 400, for example, a vertical direction.

Each of the plurality of first connection electrodes 715 connects the first connection line 710 and the second electrode 610, 620 and 630 to each other, and each of the plurality of second connection electrodes 725 connects the second connection line 720 and the second electrode 610, 620 and 630 to each other. Accordingly, each of the plurality of first connection electrodes 715 and each of the plurality of second connection electrodes 725 may extend to the upper surface of the second electrodes 610, 620 and 630 on the upper surface of the bank 400.

The third connection line 730 connects the plurality of first connection lines 710 with the plurality of second connection lines 720. The third connection line 730 may be formed in the periphery of the bank 400, for example, a pad area connected with a circuit driver. The third connection line 730 may be provided in the periphery of an active area for displaying an image, and provided to surround the active area.

The plurality of first connection lines 710, the plurality of second connection lines 720, the plurality of first connection electrodes 715, the plurality of second connection electrodes 725, and the third connection line 730 may be formed of the same material, and may be manufactured by the same process, but not necessarily. The plurality of first connection lines 710, the plurality of second connection lines 720, and the third connection line 730 may be formed of a metal material having high conductivity, and may be manufactured by the same process. The plurality of first connection electrodes 715 and the plurality of connection electrodes 725 may be formed of a transparent conductive material, and may be manufactured by the same process.

The connection layer 700 may be changed to various structures capable of electrically connecting the plurality of second electrodes 610, 620 and 630 with each other. For example, it is possible to omit the plurality of first connection lines 710 and the plurality of first connection electrodes 715, to omit the plurality of second connection lines 720 and the plurality of second connection electrodes 725, or to omit the third connection line 730.

Figure 4:
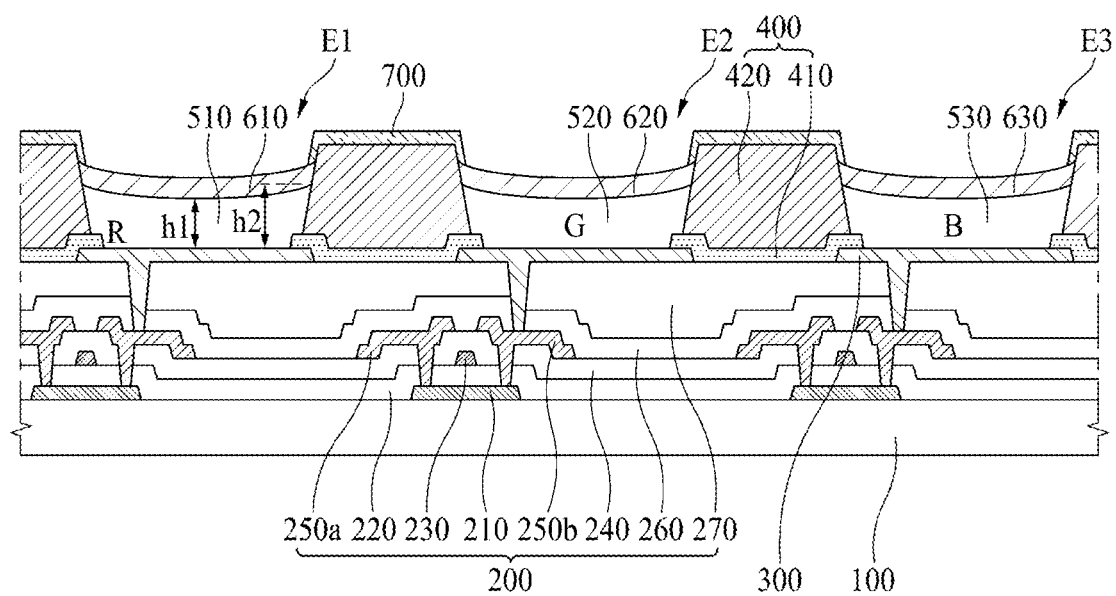
FIG. 4 is a cross sectional view illustrating an electroluminescent display device according to another embodiment of the present disclosure.

FIG. 4 is a cross sectional view illustrating an electroluminescent display device according to another embodiment of the present disclosure. Except a structure of a bank 400, the electroluminescent display device shown in FIG. 4 is identical in structure to the electroluminescent display device shown in FIG. 2, whereby the same reference numbers will be used throughout the drawings to refer to the same parts. Hereinafter, only the different structures will be described in detail as follows.

Referring to FIG. 4, a bank 400 includes a first bank 410 and a second bank 420.

The first bank 410 covers an end of a first electrode 300, and the first bank 410 is formed on a circuit device layer 200. A thickness of the first bank 410 is relatively smaller than a thickness of the second bank 420, and a width of the first bank 410 is relatively larger than a width of the second bank 420. Height is measured in a direction perpendicular to the surface of the substrate, and width is measured in a direction parallel with the surface of the substrate. In the same manner as an emission layer 510, 520 and 530, the first bank 410 having the above structure has the hydrophilic property. The first bank 410 having the hydrophilic property may be formed of an inorganic insulating material such as silicon oxide. Thus, when the emission layer 510, 520 and 530 is formed by a solution process, a solution for forming the emission layer 510, 520 and 530 may spread easily on the first bank 410.

The height (h1) of an emission layer is measured from the upper surface of the first electrode 300. The height of a second electrode 600 is also measured from the upper surface of the first electrode 300. The height of a bank 400 is measured from the upper surface of the planarization layer 270. The edge of the emission area may be considered to be where the upper surface of the emission area is in direct contact with the bank. The upper surface of a feature is the surface of the feature furthest from the first substrate and parallel to the surface of the substrate.

The second bank 420 is formed on the first bank 410. The width of the second bank 420 is smaller than the width of the first bank 410. The second bank 420 may be obtained by coating a mixture solution of an organic insulating material having the hydrophilic property and a hydrophobic material such as fluorine, and patterning the coated mixture solution by the use of photolithography process. By the light irradiated for the photolithography process, the hydrophobic material such as fluorine may move to an upper portion of the second bank 420, whereby the upper portion of the second bank 420 has the hydrophobic property, and the remaining portions of the second bank 420 have the hydrophilic property. That is, the lower portion of the second bank 420 which is in contact with the first bank 410 has the hydrophilic property, and the upper portion of the second bank 420 has the hydrophobic property, but not limited to this structure. For example, the entire portions of the second bank 420 may have the hydrophobic property.

Herein, the spreadability of the solution for forming the emission layer 510, 520 and 530 may be improved owing to the first bank 410 having the hydrophilic property and the lower portion of the second bank 420 having the hydrophilic property. Especially, as the first bank 410 has the relatively smaller thickness and the relatively larger width in comparison to the second bank 420, it is possible to prepare a 2-step structure of the hydrophilic property by the combination of the first bank 410 and second bank 420, whereby the solution for forming the emission layer 510, 520 and 530 may easily spread to the left and right ends of the emission area E1, E2 and E3.

Also, the upper portion of the second bank 420 having the hydrophobic property prevents the solution for forming the emission layer 510, 520 and 530 from spreading to another neighboring emission area E1, E2 and E3 so that it is possible to prevent the emission layer 510, 520 and 530 of one emission area E1, E2 and E3 from being mixed with the emission layer 510, 520 and 530 of another neighboring emission area E1, E2 and E3.

The first bank or the second bank may have a linear structure in the active area. A linear structure being a straight structure, i.e. the bank extends along a first direction and that has a constant cross-section perpendicular to the first direction. The first bank may be formed as a mesh structure, which is a structure comprising a single layer that provides a plurality of regular apertures, typically being rectangular apertures arranged in a rectangular array, that define a regular pattern of emission areas in the active area. An electroluminescent display device may comprise a plurality of second banks of linear structure that are parallel to each other, and that are formed on top of a first bank having a mesh structure. An electroluminescent display device may comprise a plurality of second banks of linear structure that are parallel to each other, and that are formed on top of a plurality of first banks of linear structure that are parallel to each other and perpendicular to the linear structure of the second banks. A bank with a linear structure may only have such a structure in the active area. In some cases, a bank may be formed of a plurality of linear structures that are parallel to each other, and that are connected in the dummy area surrounding the active area, forming a snaking pattern.

Figure 5:
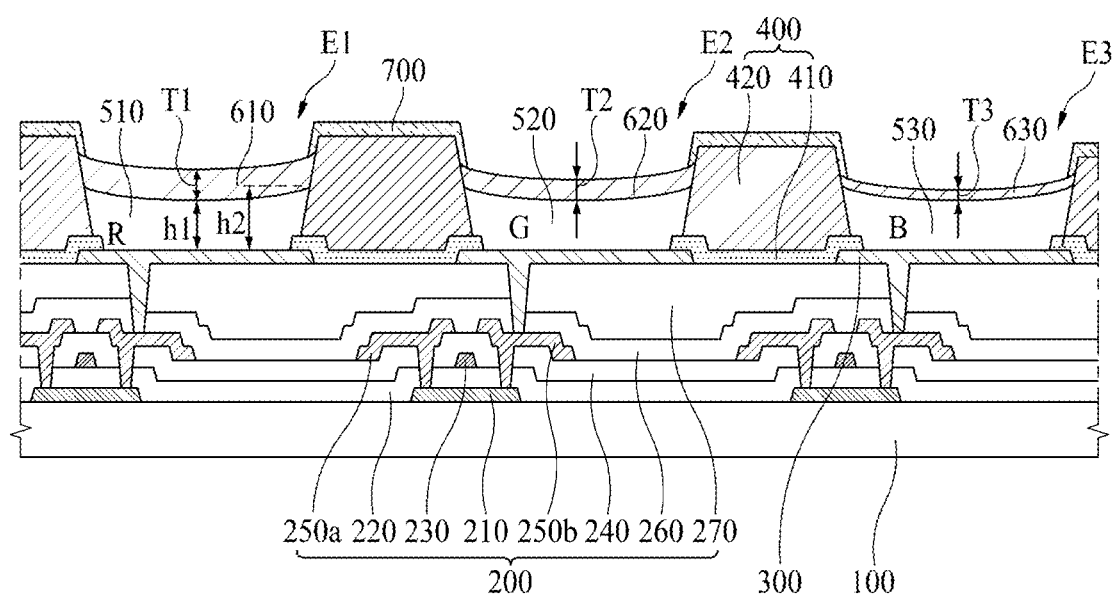
FIG. 5 is a cross sectional view illustrating an electroluminescent display device according to another embodiment of the present disclosure.

FIG. 5 is a cross sectional view illustrating an electroluminescent display device according to another embodiment of the present disclosure. Except a structure of a second electrode 610, 620 and 630, the electroluminescent display device shown in FIG. 5 is identical in structure to the electroluminescent display device shown in FIG. 2, whereby the same reference numbers will be used throughout the drawings to refer to the same parts. Hereinafter, only the different structures will be described in detail as follows.

As shown in FIG. 5, according to another embodiment of the present disclosure, a first thickness T1 of a second electrode 610 provided in a first emission area E1 is larger than a second thickness T2 of a second electrode 620 provided in a second emission area E2 and a third thickness T3 of a second electrode 630 provided in a third emission area E3. In addition, the second thickness (T2) of the second electrode 620 provided in the second emission area (E2) is larger than the third thickness (T3) of the second electrode 630 provided in the third emission area (E3). In this specification, the thicknesses T1, T2 and T3 of the second electrodes 610, 620 and 630 indicate the thickness in the center of each emission area E1, E2 and E3, respectively.

When the thickness T1, T2 and T3 of the second electrode 610, 620 and 630 is large, an electrical resistance may be reduced. Thus, the increase of the thickness T1, T2 and T3 in the second electrode 610, 620 and 630 is favorable to the reduction of resistance, preferably. However, when the electroluminescent display device according to the present disclosure is formed in a top emission type, the increase of the thickness T1, T2 and T3 in the second electrode 610, 620 and 630 may lower the light transmittance. Thus, the thickness T1, T2 and T3 of the second electrode 610, 620 and 630 has to be determined in consideration of the light transmittance.

Figure 6:
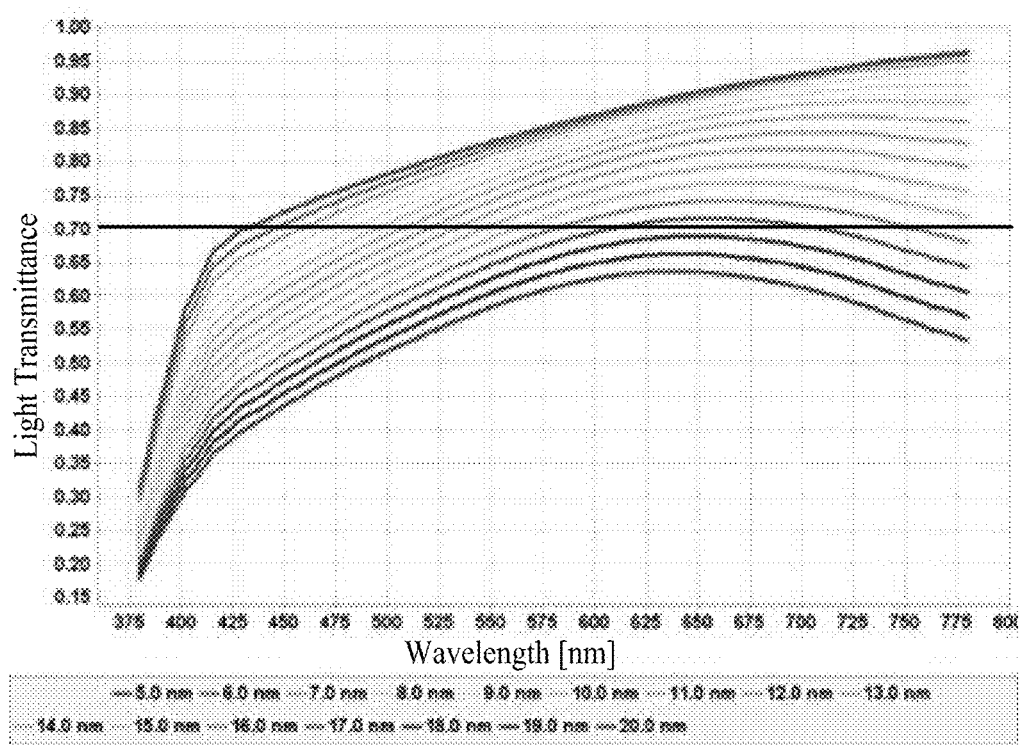
FIG. 6 is a graph showing the change of light transmittance by each wavelength range in accordance with the change of a second electrode according to one embodiment of the present disclosure.

FIG. 6 is a graph showing the change of light transmittance by each wavelength range in accordance with the change of the second electrode according to one embodiment of the present disclosure. The graph of FIG. 6 shows results obtained by changing the thickness of the second electrode 610, 620 and 630 including an alkali material such as MgAg (alloy of magnesium and silver) over the range 5.0 nm-20.0 nm.

As shown in FIG. 6, as the thickness of the second electrode 610, 620 and 630 is increased, the light transmittance is lowered. Especially, the light transmittance in a short wavelength range is the lowest, the light transmittance in a long wavelength range is the greatest, and the transmittance in a middle wavelength range is in the middle.

In consideration of the difference of light transmittance by each wavelength range, as shown in FIG. 5, the first thickness T1 of the second electrode 610 provided in the first emission area E1 for emitting red-colored light corresponding to the long wavelength range is the largest, the third thickness T3 of the second electrode 630 provided in the third emission area E3 for emitting blue-colored light corresponding to the short wavelength range is the smallest, and the second thickness T2 of the second electrode 620 provided in the second emission area E2 for emitting green-colored light corresponding to the middle wavelength range is in the middle between the first thickness T1 and the third thickness T3.

In more detail, when the transmittance of each emission area E1, E2 and E3 is set to be 70% or higher, a method for setting the thickness T1, T2 and T3 in each second electrode 610, 620 and 630 will be described as follows.

First, in case of the first emission area E1 for emitting the light having the long wavelength range, the first thickness T1 of the second electrode 610 may be set with respect to 625 nm wavelength range. In this case, when the first thickness T1 of the second electrode 610 is set to be 17 nm or less, it is possible to maintain the light transmittance of 70% or higher. Then, in case of the second emission area E2 for emitting the light having the middle wavelength range, the second thickness T2 of the second electrode 620 may be set with respect to 525 nm wavelength range. In this case, when the second thickness T2 of the second electrode 620 is set to be 12 nm or less, it is possible to maintain the light transmittance of 70% or higher. Then, in case of the third emission area E3 for emitting the light having the short wavelength range, the third thickness T3 of the second electrode 630 may be set with respect to 450 nm wavelength range. In this case, when the third thickness T3 of the second electrode 630 is set to be 6 nm or less, it is possible to maintain the light transmittance of 70% or higher. Accordingly, the thickness T1, T2 and T3 of each second electrode 610, 620 and 630 may be set in consideration of the wavelength range of the light transmittance in a designed display device.

Meanwhile, in consideration of a resistance of the second electrode 610, 620 and 630, the thickness T1, T2 and T3 of the second electrode 610, 620 and 630 is set to be 1 nm or greater. Thus, if the light transmittance is set to be 70% or higher, the first thickness T1 of the second electrode 610 provided in the first emission area E1 is set to be in a range of 1 nm to 17 nm, the second thickness T2 of the second electrode 620 provided in the second emission area E2 is set to be in a range of 1 nm to 12 nm, and the third thickness T3 of the second electrode 630 provided in the third emission area E3 is set to be in a range of 1 nm to 6 nm, preferably.

Instead of, or in addition to, variation in thickness the transparency of the second electrodes 610, 620 and 630 may vary in different emission areas. There may be three emission areas corresponding to red, green, and blue light emitting regions, each having a corresponding second electrode. The transparency of the second electrode in the blue region may be greater than the transparency of the second electrode in the green region. In turn, the transparency of the second electrode in the green region may be greater than transparency of the second electrode in the red region. The variation in transparency may be formed by variation of the thickness of the second electrode, by variation of the material properties of the second electrode in the emission regions, or by selecting a material for the second electrode that attenuates red light more than green and that attenuates green light more than blue light. By variation of the transparency and/or thickness light attenuation can be optimized, thereby improving the quality of the images formed by the display device.

Although not shown in detail, the bank 400 of FIG. 5 may include the first bank 410 and the second bank 420, as shown in FIG. 4.

Figure 7:
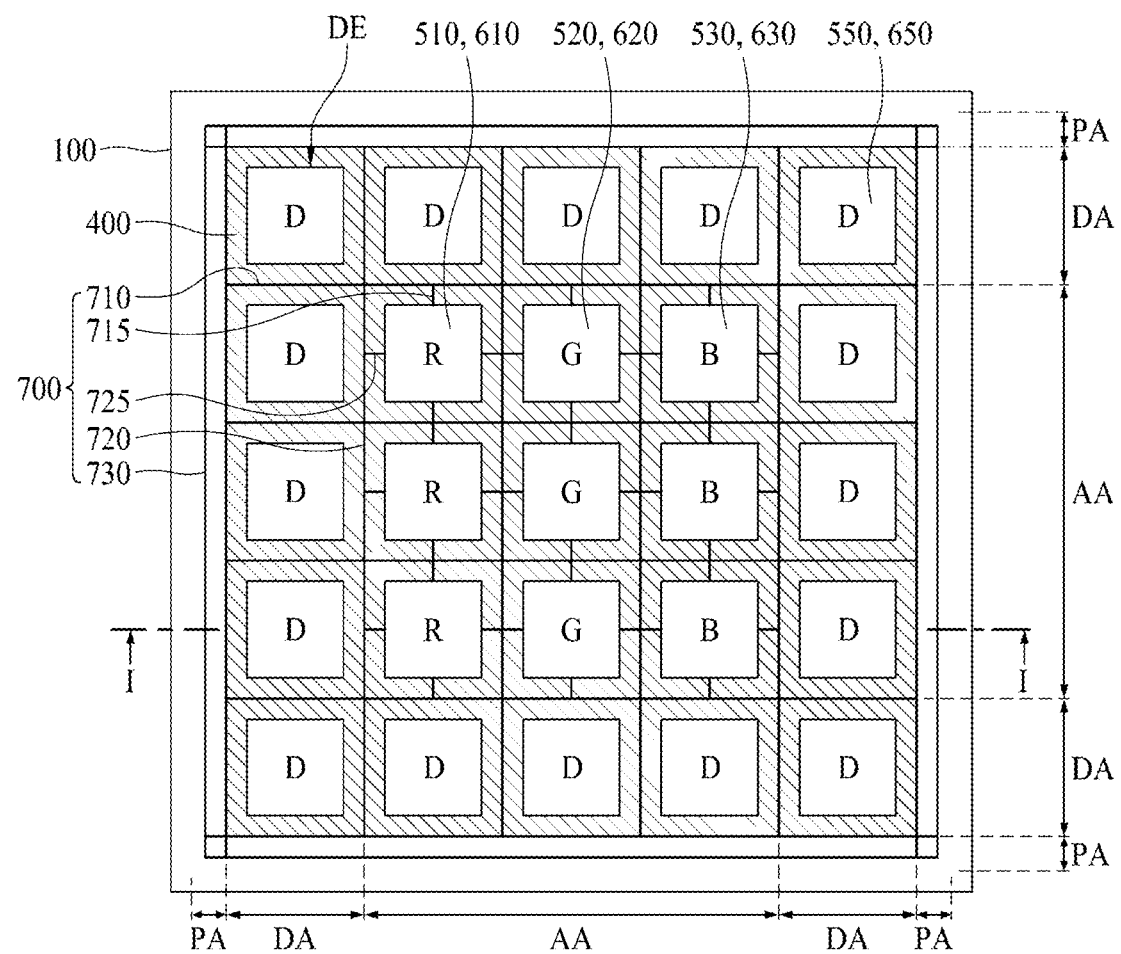
FIG. 7 is a plan view illustrating an electroluminescent display device according to another embodiment of the present disclosure.

FIG. 7 is a plan view illustrating an electroluminescent display device according to another embodiment of the present disclosure, which relates to an electroluminescent display device including an active area AA, a dummy area DA, and a pad area PA.

The active area AA functions as a display area for displaying an image. In the active area AA, a bank 400 is provided to define a first emission area E1, a second emission area E2, and a third emission area E3, wherein a first emission layer 510 and a second electrode 610 are provided in the first emission area E1, a second emission layer 520 and a second electrode 620 are provided in the second emission area E2, and a third emission layer 530 and a second electrode 630 are provided in the third emission area E3.

The dummy area DA is provided to surround the active area AA. In detail, the dummy area DA is provided in left, right, lower and upper peripheral sides of the active area AA. In the same manner as the active area AA, there is a bank 400 for defining a dummy emission area DE in the dummy area DA. Also, a dummy emission layer 550 and a dummy second electrode 650 are provided in the dummy emission area DE. The bank 400 is formed in a matrix configuration on the entire active area AA and dummy area DA, to thereby define the emission area E1, E2 and E3 and the dummy emission area DE. In FIG. 7, the bank 400 is shaded.

The dummy area DA is not the display area for displaying an image, and a light emission is not generated in the dummy emission area DE of the dummy pixel provided in the dummy area DA. The dummy area DA is provided to realize a uniform profile between the emission layer 510, 520 and 530 formed in the center of the active area AA and the emission layer 510, 520 and 530 formed in the periphery of the active area AA.

When the emission layer 510, 520 and 530 is formed by a solution process, it may cause the difference between a drying speed of the emission layer 510, 520 and 530 formed in the middle of a substrate and a drying speed of the emission layer 510, 520 and 530 formed in the edge of the substrate. Thus, when forming only the active area AA without the dummy area DA, the profile of the emission layer 510, 520 and 530 formed in the middle of the active area AA and the profile of the emission layer 510, 520 and 530 formed in the edge of the active area AA may be non-uniform, whereby the light emission in the middle of the active area AA and the light emission in the edge of the active area AA may be non-uniform.

Thus, according to another embodiment of the present disclosure, when the dummy area DA is formed in the periphery of the active area AA, and the emission layer 510, 520 and 530 is formed in the active area AA by the solution process, the dummy emission layer 550 is also formed in the dummy area DA by the solution process. In this case, even though the profile of the dummy emission layer 550 and the profile of the emission layer 510, 520 and 530 are not uniform, it is possible to realize the uniform profile of the emission layer 510, 520 and 530 in the entire active area AA. For reference, in FIG. 7, the dummy emission layer 550 in which the light emission is not generated is marked as 'D' so as to distinguish the emission layer 510, 520 and 530 for emitting red R, green G, and blue B light, which will be identically applied in FIGS. 8 and 9.

Also, according to another embodiment of the present disclosure, when the second electrode 610, 620 and 630 is formed in the active area AA by the solution process, the dummy second electrode 650 is also formed in the dummy area DA by the solution process. In this case, even though the profile of the dummy second electrode 650 and the profile of the second electrode 610, 620 and 630 are not uniform, it is possible to realize the uniform profile of the second electrode 610, 620 and 630 in the entire active area AA.

The pad area PA is provided in the periphery of the dummy area DA.

A circuit driver such as a gate driver or a data driver may be provided in the pad area PA. The circuit driver may be formed in at least one of left, right, lower and upper peripheral sides of the dummy area DA. The circuit driver provided in the pad area PA is connected to the circuit device inside the active area AA via the dummy area DA.

According to another embodiment of the present disclosure, a connection layer 700 is formed on an upper surface of the bank 400 while overlapping with the bank 400. The connection layer 700 may include a plurality of first connection lines 710, a plurality of second connection lines 720, a plurality of first connection electrodes 715, a plurality of second connection electrodes 725, and a third connection line 730.

The plurality of first connection lines 710 are arranged in a first direction, for example, a horizontal direction on the upper surface of the bank 400 provided in the active area AA and the dummy area DA, and the plurality of first connection lines 710 may extend to the pad area PA. The plurality of second connection lines 720 are arranged in a second direction, for example, a vertical direction on the upper surface of the bank 400 provided in the active area AA and the dummy area DA, and the plurality of second connection lines 720 may extend to the pad area PA.

Each of the plurality of first connection electrodes 715 connects the first connection line 710 and the second electrode 610, 620 and 630 with each other on the upper surface of the bank 400 provided in the active area AA. Each of the plurality of second connection electrodes 725 connects the second connection line 720 and the second electrode 610, 620 and 630 with each other on the upper surface of the bank 400 provided in the active area AA. Accordingly, each of the plurality of first connection electrodes 715 and each of the plurality of second connection electrodes 725 may extend to the upper surface of the second electrodes 610, 620 and 630 on the upper surface of the bank 400 provided in the active area AA. However, each of the plurality of first connection electrodes 715 and each of the plurality of second connection electrodes 725 is not provided in the dummy area DA. This is because the dummy area DA is not the light emission area. That is, there is no need to apply a voltage to the dummy second electrode 650 provided in the dummy area DA. That is, as the second electrode 610, 620 and 630 is connected to the connection line 700, it is possible to apply a common voltage via the connection line 700. However, the dummy second electrode 650 is not connected to the connection line 700, whereby there is no need to apply the common voltage thereto.

The third connection line 730 connects the plurality of first connection lines 710 with each other in the pad area PA and also connects the plurality of second connection lines 720 with each other in the pad area PA. The third connection line 730 may be connected to the circuit driver provided in the pad area PA.

Herein, the material and structure in each of the plurality of first connection lines 710, the plurality of second connection lines 720, the plurality of first connection electrodes 715, the plurality of second connection electrodes 725, and the third connection line 730 may be the same as those of FIG. 3, whereby a detailed description for the same parts will be omitted.

Figure 8:
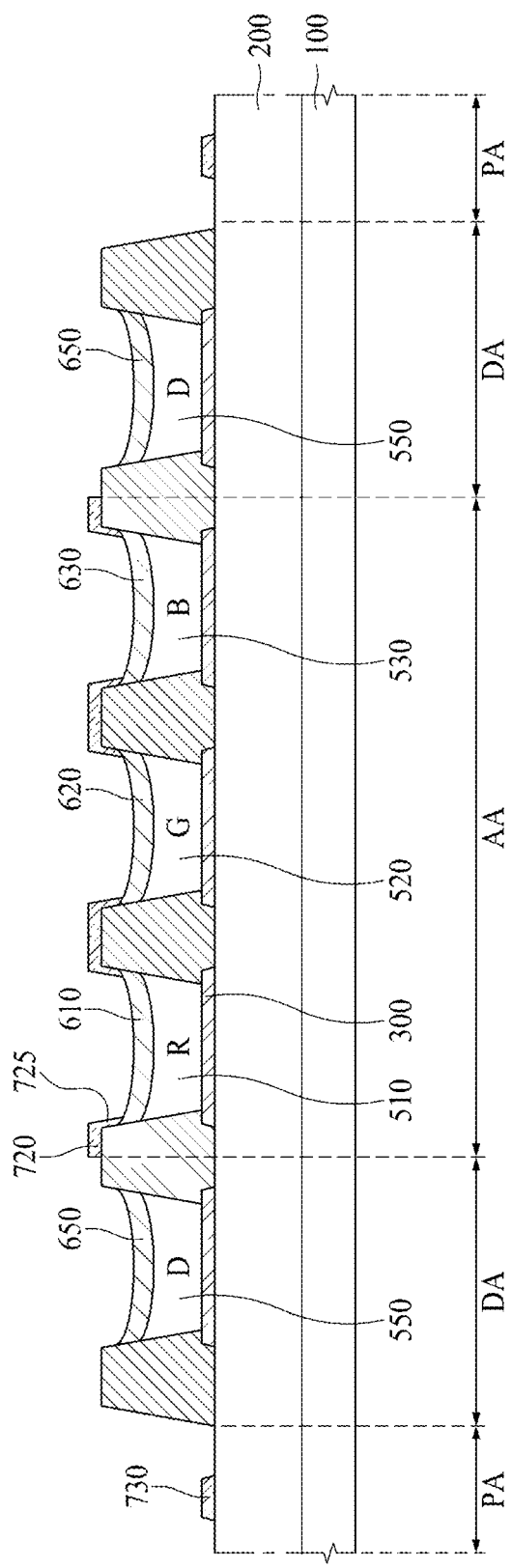
FIG. 8 is a cross sectional view illustrating an electroluminescent display device according to another embodiment of the present disclosure, which corresponds to a cross section along I-I of FIG. 7.

FIG. 8 is a cross sectional view illustrating an electroluminescent display device according to another embodiment of the present disclosure, which corresponds to a cross section along I-I of FIG. 7. FIG. 8 illustrates that an active area AA is formed in the structure of FIG. 2.

The electroluminescent display device according to another embodiment of the present disclosure may include a substrate 100, a circuit device layer 200, a first electrode 300, a bank 400, an emission layer 510, 520 and 530, a dummy emission layer 550, a second electrode 610, 620 and 630, a dummy second electrode 650, a second connection line 720, a second connection electrode 725, and a third connection line 730.

The circuit device layer 200 is formed in an active area AA, a dummy area DA, and a pad area PA. The circuit device layer 200 formed in the dummy area DA may be identical in structure to the circuit device layer 200 formed in the active area AA, and the circuit device layer 200 formed in the dummy area DA and the circuit device layer 200 formed in the active area AA may be manufactured by the same process, but not necessarily. That is, some of signal lines such as a gate line, a data line, a power line, and a reference line may be not included in the circuit device layer 200 formed in the dummy area DA, or some of a switching thin film transistor and a driving thin film transistor may not be included in the circuit device layer 200 formed in the dummy area DA, whereby a light emission may be not generated in the dummy area DA. In some cases, the circuit device layer 200 formed in the dummy area DA may be configured incompletely so as not to operate any one of the switching thin film transistor and the driving thin film transistor. In case of the circuit device layer 200 formed in the pad area PA, the signal line provided in the active area AA may extend to the circuit device layer 200 formed in the pad area PA, and the thin film transistor for the light emission may not be included in the circuit device layer 200 formed in the pad area PA unlike the active area AA. In other cases, a driving device for driving a circuit device provided in the active area AA may be included in the pad area PA. In this case, a thin film transistor for the driving device may be included in the pad area PA.

The first electrode 300 is formed in the active area AA and the dummy area DA. The first electrode 300 formed in the dummy area DA may be identical in structure to the first electrode 300 formed in the active area AA, and the first electrode 300 formed in the dummy area DA and the first electrode 300 formed in the active area AA may be manufactured by the same process. The first electrode 300 may not be formed in the dummy area DA, whereby a light emission may be not generated in the dummy area DA.

The bank 400 is formed in the active area AA and the dummy area DA. The bank 400 formed in the dummy area DA may be identical in structure to the bank 400 formed in the active area AA, and the bank 400 formed in the dummy area DA and the bank 400 formed in the active area AA may be manufactured by the same process. Although not shown in detail, the bank 400 may include first and second banks 410 and 420, as described in FIG. 4.

The emission layer 510, 520 and 530 is formed in the active area AA. The emission layer 510, 520 and 530 may be formed by the solution process, as described in FIG. 2, and a detailed description for the emission layer 510, 520 and 530 will be omitted.

The dummy emission layer 550 is formed in the dummy area DA. The structure of the dummy emission layer 550 may be identical the structure of any one of the first, second, and third emission layers 510, 520 and 530. That is, in the same manner as the first emission layer 510, the dummy emission layer 550 may include a hole injecting layer HIL, a hole transporting layer HTL, and a red emitting material layer EML(R). The dummy emission layer 550 may include a green emitting material layer EML(G) instead of the red emitting material layer EML(R), whereby it may have the same structure as that of the second emission layer 520. The dummy emission layer 550 may include a blue emitting material layer EML(B) instead of the red emitting material layer EML(R), whereby it may have the same structure as that of the third emission layer 530. Each of the hole injecting layer HIL, the hole transporting layer HTL, the red emitting material layer EML(R), the green emitting material layer EML(G), and the blue emitting material layer EML(B) constituting the dummy emission layer 550 may be formed by the solution process.

The plurality of dummy emission layers 550 may be provided in the dummy area DA, wherein the plurality of dummy emission layers 550 may be formed in the same structure, but not necessarily. Among the plurality of the dummy emission layers 550, some of the dummy emission layers 550 may be formed in the same structure as that of the first emission layer 510, some other dummy emission layers 550 may be formed in the same structure as that of the second emission layer 520, and the remaining dummy emission layers 550 may be formed in the same structure as that of the third emission layer 530.

The second electrode 610, 620 and 630 is formed on the emission layer 510, 520 and 530 in the active area AA. The second electrode 610, 620 and 630 may be formed by the solution process, as shown in another embodiment of FIG. 2, whereby a detailed description for the second electrode 610, 620 and 630 will be omitted.

The dummy second electrode 650 is formed on the dummy emission layer 550 in the dummy area DA. The dummy second electrode 650 is formed in the same structure as that of the second electrode 610, 620 and 630. That is, the dummy second electrode 650 may include a mixture material obtained by mixing a conductive material such as silver (Ag) with at least one among an alkali component, a metal oxide material, and a metal carbonate material. The dummy second electrode 650 may be formed by preparing the mixture material obtained by mixing the conductive material such as silver (Ag) with at least one among the alkali component, the metal oxide material, and the metal carbonate material, and carrying out the solution process with the mixture material by the use of an inkjet apparatus. Also, the dummy second electrode 650 may be formed at the same thickness as that of the second electrode 610, 620 and 630. In this present disclosure, the thickness of the dummy second electrode 650 indicates the thickness in the center of the dummy emission area DE.

The second connection line 720 is formed on an upper surface of the bank 400 of the active area AA, and the second connection electrode 725 extends from the second connection line 720 to an upper surface of the second electrode 610, 620 and 630. The third connection line 730 is formed in the pad area PA. The bank 400 may be not provided in the pad area PA, whereby the third connection line 730 may be formed on the circuit device layer 200.

Figure 9:
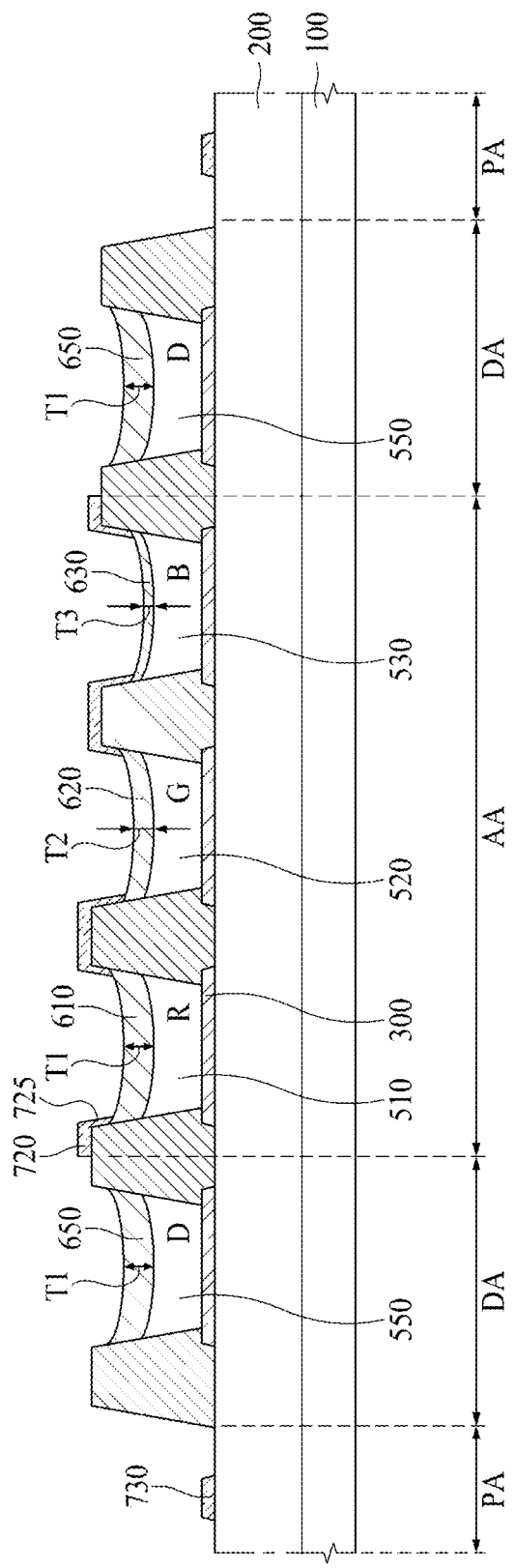
FIG. 9 is a cross sectional view illustrating an electroluminescent display device according to another embodiment of the present disclosure, which corresponds to a cross section along I-I of FIG. 7.

FIG. 9 is a cross sectional view illustrating an electroluminescent display device according to another embodiment of the present disclosure, which corresponds to a cross section along I-I of FIG. 7. FIG. 9 illustrates that an active area AA is formed in the same structure as that of FIG. 5. Thus, except a thickness T1, T2 and T3 of a second electrode 610, 620 and 630 and a thickness T1 of a second dummy electrode 650, the structure of FIG. 9 is identical to the structure of FIG. 8, whereby only the different structures will be described in detail.

Referring to FIG. 9, a first thickness T1 of a second electrode 610 provided on a first emission layer 510 is larger than a second thickness T2 of a second electrode 620 provided on a second emission layer 520 and a third thickness T3 of a second electrode 630 provided on a third emission layer 530, and the second thickness T2 of the second electrode 620 provided on the second emission layer 520 is larger than the third thickness T3 of the second electrode 630 provided on the third emission layer 530, as described above in FIG. 5.

Also, a second dummy electrode 650 has a thickness T1 which is identical to the first thickness T1 of the second electrode 610 provided on the first emission layer 510. In this case, the second dummy electrode 650 may be formed by spraying a solution by the use of inkjet nozzle, wherein the amount of solution sprayed is the same as the amount of solution for the second electrode 610 provided on the first emission layer 510, but not necessarily. In other embodiments, the second dummy electrode 650 may have a thickness T2 which is identical to the second thickness T2 of the second electrode 620 provided on the second emission layer 520, or may have a thickness T3 which is identical to the third thickness T3 of the second electrode 630 provided on the third emission layer 530.

Meanwhile, the plurality of second dummy electrodes 650 is provided in the dummy area DA, wherein the plurality of second dummy electrodes 650 may have the same thickness. The light emission is not generated in the dummy area DA. In this reason, there is no need to consider the light transmittance when the thickness of the second dummy electrode 650 provided in the dummy area DA is set.

According to the present disclosure, both the emission layer and the second electrode may be formed by the solution process so that it is possible to reduce manufacturing cost and processing time. Especially, the second electrode includes the material having the electron injecting property and the electron transporting property so that it is possible to remove the electron injecting layer and the electron transporting layer from the emission layer, that is, it is possible to shorten a processing time for forming the emission layer.

It will be apparent to those skilled in the art that the present disclosure described above is not limited by the above-described embodiments and the accompanying drawings and that various substitutions, modifications, and variations can be made in the present disclosure without departing from the scope of the disclosure. Consequently, the scope of the present disclosure is defined by the accompanying claims. It is intended that all variations or modifications derived from the meaning, scope, and equivalent concept of the disclosure fall within the scope of the accompanying claims.

These and other changes can be made to the embodiments in light of the above-detailed description. In general, in the following claims, the terms used should not be construed to limit the claims to the specific embodiments disclosed in the specification, but should be construed to include the full scope to which such claims are entitled.

What is claimed:
1. An electroluminescent display device comprising:
a substrate;
a first electrode of a first subpixel provided on the substrate;
a bank including a first bank configured to cover an end of the first electrode and a second bank formed on the first bank and configured to define a first emission area of the first subpixel;
a first emission layer of the first subpixel, the first emission layer provided in the first emission area defined by the second bank;
a second electrode of the first subpixel, the second electrode including a first transparent conductive material and provided on the first emission layer, the second electrode of the first subpixel being isolated within the first emission area of the first subpixel; and a connection layer provided on the second bank, the connection layer connecting the second electrode of the first subpixel with another second electrode of another subpixel neighboring the first subpixel, the connection layer being non-integral with the second electrode and including a second transparent conductive material that is different from the first transparent conductive material or an opaque conductive material, wherein a profile of an upper surface of the second electrode has a first curvature in a center of the second electrode and a second curvature at an edge of the second electrode, and wherein the second curvature is greater than the first curvature.

2. The electroluminescent display device according to claim 1, wherein the first emission layer includes a hole injecting layer, a hole transporting layer, and an emitting material layer, and the second electrode includes a material having an electron injecting property and an electron transporting property.

3. The electroluminescent display device according to claim 2, wherein the material having the electron injecting property and the electron transporting property includes at least one of an alkali material, a metal oxide, and a metal carbonate.

4. The electroluminescent display device of claim 1, wherein the connection layer includes the opaque conductive material.

5. The electroluminescent display device according to claim 1, wherein a profile of the first emission layer has a height in a center of the emission area that is lower than a height at an edge of the emission area, and a profile of the second electrode corresponds to a profile of the emission layer.

6. The electroluminescent display device according to claim 1 further comprising:

a second emission layer of the second subpixel provided in a second emission area of the second subpixel, a third emission layer of a third subpixel provided in a third emission area of the third subpixel, wherein the second emission layer and the third emission layer each include a hole injecting layer, a hole transporting layer, and an emitting material layer, and separate second electrodes on the second emission layer, and the third emission layer, and wherein a first thickness of the second electrode provided on the first emission layer, a second thickness of the second electrode provided on the second emission layer, and a third thickness of the second electrode provided on the third emission layer are different from each other.

7. The electroluminescent display device according to claim 6, wherein a profile of each emission layer has a height in a center of the emission area that is lower than a height at an edge of the emission area, and a profile of the second electrode on each emission layer corresponds to the profile of the corresponding emission layer.

8. The electroluminescent display device according to claim 6, wherein the first emission layer is configured to emit red-colored light, the second emission layer is configured to emit green-colored light, and the third emission layer is configured to emit blue-colored light, and wherein the first thickness is larger than both the second thickness and the third thickness, and the second thickness is larger than the third thickness.

9. The electroluminescent display device according to claim 6, wherein:

the center of the second electrode on the first emission layer has a first thickness;

a center of the second electrode on the second emission layer has a second thickness;

a center of the second electrode on the third emission layer has a third thickness; and the first thickness, second thickness, and third thickness are different from each other.

10. The electroluminescent display device according to claim 6, wherein the second electrode on the first emission layer has a first transparency, the second electrode on the second emission layer has a second transparency, the second electrode on the third emission layer has a third transparency; and the first, second, and third transparency are different from each other.

11. The electroluminescent display device according to claim 1, wherein the second bank is formed as a linear structure.

12. The electroluminescent display device according to claim 1, wherein the second electrode has a first thickness at the center of the second electrode and a second thickness at the edge of the second electrode, and the first thickness and the second thickness are different.

13. The electroluminescent display device according to claim 12, wherein the second thickness is greater than the first thickness.

14. An electroluminescent display device comprising:

a substrate including an active area for displaying an image, and a dummy area provided around a periphery of the active area;

a bank including a first bank and a second bank formed on the first bank, wherein the second bank is configured to define a plurality of emission areas on the active area of the substrate and a plurality of dummy emission areas on the dummy area of the substrate;

a plurality of emission layers respectively provided in the plurality of emission areas defined by the second bank;

a plurality of electrodes respectively provided on the plurality of emission layers within the emission areas defined by the second bank;

a plurality of dummy emission layers respectively provided in the plurality of dummy emission areas defined by the second bank;

a plurality of dummy electrodes respectively provided on the plurality of dummy emission layers; and a connection layer provided on the second bank for connecting the plurality of electrodes to each other, wherein the connection layer includes a plurality of first connection lines extending in a first direction on an upper surface of the second bank, and a plurality of first connection electrodes for connecting the plurality of first connection lines to the plurality of electrodes, the plurality of first connection lines are provided in the active area and the dummy area, and the plurality of first connection electrodes are provided in the active area.

15. The electroluminescent display device according to claim 14, wherein the connection layer is not connected to the plurality of dummy electrodes.

16. The electroluminescent display device according to claim 14, wherein the substrate additionally includes a pad area provided around a periphery of the dummy area, and the connection layer further includes an additional connection line for connecting the plurality of first connection lines with each other in the pad area.

17. The electroluminescent display device according to claim 14, wherein each emission layer includes a hole injecting layer, a hole transporting layer, and an emitting material layer, and
each electrode of the plurality of electrodes includes a material having an electron injecting property and an electron transporting property.

18. The electroluminescent display device according to claim 14, wherein the plurality of emission layers includes a first emission layer provided in a first emission area, a second emission layer provided in a second emission area, and a third emission layer provided in a third emission area,
the plurality of electrodes comprises an electrode provided on the first emission layer, an electrode provided on the second emission layer, and an electrode provided on the third emission layer, and
a first thickness of the electrode provided on the first emission layer, a second thickness of the electrode provided on the second emission layer, and a third thickness of the electrode provided on the third emission layer are different from each other.

19. The electroluminescent display device according to claim 18,
wherein the first emission layer is configured to emit red-colored light, the second emission layer is configured to emit green-colored light, and the third emission layer is configured to emit blue-colored light, and
the first thickness is larger than both the second thickness and the third thickness, and the second thickness is larger than the third thickness.

20. An electroluminescent display device comprising:
a substrate;
a plurality of first electrodes provided on the substrate;
a bank including a first bank configured to cover an end of each first electrode and a second bank formed on the first bank and configured to define a first emission area, a second emission area, and a third emission area;
a first emission layer provided in the first emission area defined by the second bank;
a second emission layer provided in the second emission area defined by the second bank;
a third emission layer provided in the third emission area defined by the second bank;
a second electrode provided on the first emission layer within the first emission area, a second electrode provided on the second emission layer within the second emission area, and a second electrode provided on the third emission layer within the third emission area; and
a connection layer provided on the second bank for connecting the second electrode provided on the first emission layer, the second electrode provided on the second emission layer, and the second electrode provided on the third emission layer to each other,
wherein the connection layer includes a plurality of first connection lines extending in a first direction on an upper surface of the second bank, and a plurality of first connection electrodes for connecting the plurality of first connection lines with the second electrodes provided on the first emission layer, the second emission layer, and the third emission layer, and
wherein the connection layer includes a plurality of second connection lines extending in a second direction, which is different from the first direction, on the upper surface of the second bank, and a plurality of second connection electrodes for connecting the plurality of second connection lines with the second electrodes provided on the first emission layer, the second emission layer, and the third emission layer.

21. The electroluminescent display device according to claim 20, wherein, for each second electrode, the second electrode has a first thickness at a center of a corresponding emission area and a second thickness at an edge of the corresponding emission area, and the first thickness and the second thickness are different.

22. The electroluminescent display device according to claim 21, wherein the second thickness is greater than the first thickness.

23. The electroluminescent display device according to claim 20, wherein, for each emission layer, the emission layer has a first height at a center of a corresponding emission area and a second height at an edge of the corresponding emission area, and the first height is lower than the second height.

24. The electroluminescent display device according to claim 20, wherein a thickness of the second electrode provided on the first emission layer at a center of the emission area is thicker than a thickness of the connection layer at a center of the second bank.

25. The electroluminescent display device according to claim 20, wherein the second electrode provided on each emission layer is thicker than the connection layer.

26. The electroluminescent display device according to claim 20, wherein the second bank is formed as a linear structure.

27. The electroluminescent display device according to claim 20, wherein the connection line additionally includes a third connection line for connecting the plurality of first connection lines and the plurality of second connection lines, and wherein the third connection line is provided around a periphery of the second bank.

28. The electroluminescent display device according to claim 20,
wherein each of the first emission layer, the second emission layer, and the third emission layer includes a hole injecting layer, a hole transporting layer, and an emitting material layer, and
each of the second electrode provided on the first emission layer, the second electrode provided on the second emission layer, and the second electrode provided on the third emission layer includes a material having an electron injecting property and an electron transporting property.

29. The electroluminescent display device according to claim 20,
wherein the first emission layer is configured to emit red-colored light, the second emission layer is configured to emit green-colored light, and the third emission layer is configured to emit blue-colored light, and
wherein a first thickness of the second electrode on the first emission area is larger than both a second thickness of the second electrode on the second emission area and a third thickness of the second electrode on the third emission area, and the second thickness is larger than the third thickness.

* * * * *